United States Patent [19]

Yamanaka et al.

[11] 4,353,754
[45] Oct. 12, 1982

[54] THERMO-SENSITIVE SWITCHING ELEMENT MANUFACTURING METHOD

[75] Inventors: Kenichi Yamanaka; Yutaka Mihashi; Toshio Sogo, all of Itami, Japan

[73] Assignee: Mitsubishi Denki Kabushiki Kaisha, Tokyo, Japan

[21] Appl. No.: 175,568

[22] Filed: Aug. 6, 1980

[30] Foreign Application Priority Data

Aug. 6, 1979 [JP] Japan .................. 54/101576

[51] Int. Cl.³ .................. H01L 21/265; H01L 23/56
[52] U.S. Cl. .................. 148/1.5; 29/573; 29/576 B; 357/28; 357/91
[58] Field of Search .............. 29/573, 576 B; 357/38, 357/28, 29, 91; 148/1.5

[56] References Cited

U.S. PATENT DOCUMENTS 3,925,106 12/1975 Ku et al. .................. 148/1.5
4,151,011 4/1979 Mihashi et al. .................. 148/1.5

Primary Examiner—L. Dewayne Rutledge
Assistant Examiner—David A. Hey
Attorney, Agent, or Firm—Sughrue, Mion, Zinn, Macpeak & Seas

[57] ABSTRACT

A thermo-sensitive semiconductor element having a four-layer pnpn structure. A defect layer is formed at the junction of the p base layer and the n base layer by implantation of argon ions to provide a semiconductor element having a desired thermo-sensitive characteristic. The element is subjected to heat treatment such as annealing at temperatures in a range of from 400° C. to 900° C. in a nitrogen atmosphere after the argon ion implantation so that the leakage current into the element having the defect layer is controlled.

4 Claims, 3 Drawing Figures

ANNEALING CHARACTERISTICS OF
$J_2$ JUNCTION LEAK CURRENT

ANNEALING CHARACTERISTICS OF
$J_2$ JUNCTION LEAK CURRENT

THERMO-SENSITIVE SWITCHING ELEMENT MANUFACTURING METHOD

BACKGROUND OF THE INVENTION

The present invention relates to a method of manufacturing a negative resistance semiconductor device structure known as a thyristor having a pnpn junction. Particularly, the invention relates to a thermo-sensitive switching element which utilizes the thermal characteristics of a thyristor.

An example of a thermo-sensitive thyristor structure switching element is shown in FIG. 1. A thyristor is usually shown schematically as a three-electrode element having anode, cathode and gate electrodes. However, internally it is a compound element made up of an npn transistor and a pnp transistor.

This structure will be described with reference to FIG. 1 in more detail. In FIG. 1, reference character 1 designates the anode region of the thyristor and which acts as the emitter of the pnp transistor. A region 2 is employed as the gate of the thyristor, the base of the pnp transistor or the collector of the npn transistor and is hereinafter referred to as "an n base region" when applicable. A region 3 is employed as the gate of the thyristor and acts as the collector of the thyristor and acts as the collector of the pnp transistor or the base of the npn transistor and is hereinafter referred to as "a p base region" when applicable. A region 4 is the cathode region of the thyristor and acts as the emitter of the npn transistor. Further in FIG. 1, reference numeral 5 designates an electrode formed with aluminum or the like, 6 a surface protecting oxide film of silicon dioxide ($SiO_2$) or the like, 7 an isolation layer, and 8 a defect layer which is intentionally formed by implantation of argon ions in the collector junction.

In operation, the thyristor structure element as described above acting as a thermo-sensitive switching element is placed in thermal contact with an object whose temperature is to be measured and a DC voltage or an AC voltage is applied between the anode 1 and the cathode 4 in such a manner that the anode is at a positive voltage while the cathode is at a negative voltage. When the temperature of the object reaches a predetermined value, the switching element is operated. That is, the "off" or high resistance state between the anode 1 and the cathode 4 changes to the "on" or low resistance state.

Such a thermo-sensitive switching operation can be carried out with an ordinary thyristor. However, the use of an ordinary thyristor is limited because its switching temperature is very high. In order to eliminate this limitation and to thus make the thyristor structure element more useful as a thermo-sensitive switching element, the following techniques have been employed to cause the switching element to operate at a lower temperature. First, the common base current amplification factors ($\alpha npn$) and ($\alpha pnp$) of the npn transistor regions 2, 3 and 4 and the pnp transistor regions 1, 2 and 3 have been increased. Secondly the reverse leakage current $I_0$ in the pn junction $J_2$ formed by the n base region 2 and the p base region 3 was increased. Alternatively, the temperature dependencies of the factors ($\alpha npn$), ($\alpha pnp$) and $I_0$ have been increased.

However, if the common base current amplification factors ($\alpha npn$) and ($\alpha pnp$) are excessively increased, then the switching characteristic tends to become unstable and accordingly the switching element may be operated erroneously by external noise. Therefore, in general, the technique of increasing the leakage current $I_0$ in the pn junction $J_2$ has been preferred. In an example of such a technique, as shown in FIG. 1, the defect layer 8 is formed by implantation of argon ions into the pn junction $J_2$. This defect layer 8 acts as a recombination center for forming a recombination current to thereby increase the leakage current. The thermo-sensitive switching temperature can be reduced to a low value by increasing the leakage current as described above. In addition, the amount of leakage current can be readily controlled because the amount of argon ions implanted can be controlled with a high accuracy.

On the other hand, the thermo-sensitive characteristic of the thermo-sensitive thyristor is determined by the mutual relation of the reverse leakage current $I_0$ of the pn junction $J_2$ and the common base current amplification factors ($\alpha npn$) and ($\alpha pnp$). Therefore, in order to manufacture a thermo-sensitive thyristor having a desired characteristic with a high accuracy, it is necessary that the common base current amplification factors ($\alpha npn$) and ($\alpha pnp$) be correctly determined before argon ion implanation is carried out. However, on a semiconductor wafer, it is considerably difficult to measure the values ($\alpha npn$) and ($\alpha pnp$) with extremely small currents and, even if the measurement can be achieved, the measurement results are very low in accuracy. Therefore, the thermo-sensitive characteristic of the manufactured thermo-sensitive thyristor can be expected unavoidably to deviate from the desired characteristic.

Accordingly, an object of the invention is to provide a method of manufacturing semiconductor elements having a desired thermo-sensitive characteristic with a high yield and in which all of the above-described difficulties accompanying a conventional thyristor structure thermo-sensitive switching element manufacturing method have been eliminated.

SUMMARY OF THE INVENTION

In accordance with this and other objects of the invention, there is provided a method of manufacturing a thermo-sensitive semiconductor element in a thyristor configuration having a four-layer pnpn structure including a first semiconductor region of a first conductivity type, a second semiconductor region of a second conductivity type in contact with the first semiconductor region through a first pn junction, a third semiconductor region of the first conductivity type in contact with the second semiconductor region through a second pn junction, and a fourth semiconductor region of the second conductivity type in contact with the third semiconductor region through a third pn junction with the second pn junction having a defect layer formed therein by implantation of argon ions including subjecting the element to annealing at a temperature in a range of from 400° C. to 900° C. in a nitrogen atmosphere following the argon ion implantation. Preferably, the temperature of the annealing is determined in accordance with a desired switching temperature. The argon ion implantation is preferably carried out at a dose of from $1 \times 10^{14}/cm^2$ to $1 \times 10^{15}/cm^2$ with an energy of 180 KeV. The preferred time period of carrying out the annealing is approximately one hour. In a specific preferred example, the annealing is carried out at a temperature of 430° C. in a nitrogen atmosphere following the argon ion implantation.

DESCRIPTION OF THE PREFERRED EMBODIMENTS

A preferred embodiment of a method of the invention will be described below in detail.

As described above, when argon ions are implanted into a silicon substrate according to the known ion implantation method, the argon ions collide with silicon atoms in the crystal dislocating some of the silicon atoms and hence creating a number of defects in the silicon substrate. The defects may be reduced by annealing. However, the degree of recovery depends on the time and temperature of the annealing. If the annealing is carried out at a low temperature and for a short time, additional defects may be formed by the mutual action of the implanted argon ions and silicon atoms.

If a lattice defect is formed in the pn junction by implantation of argon ions, the reverse leakage current in the junction is increased by recombination current due to the presence of the defect. If such a junction is subjected to annealing in a nitrogen atmosphere, the reverse leakage current in the junction changes with the above-described defect variation.

Figure 1:
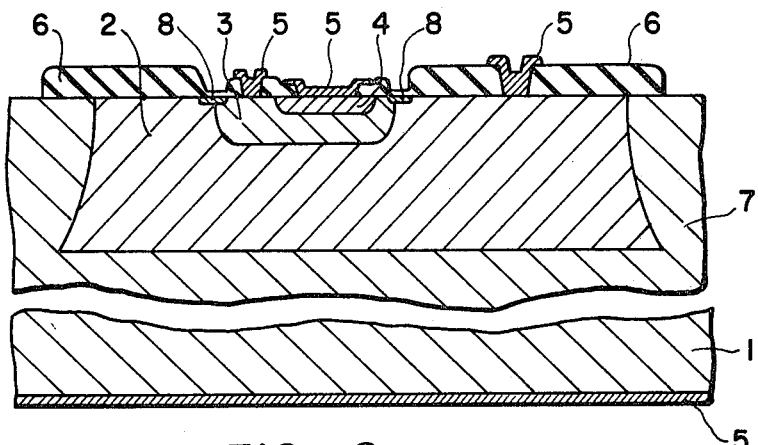
FIG. 1 is a sectional view of a thermo-sensitive thyristor element to which a preferred semiconductor manufacturing method according to the invention is applied.
Figure 2:
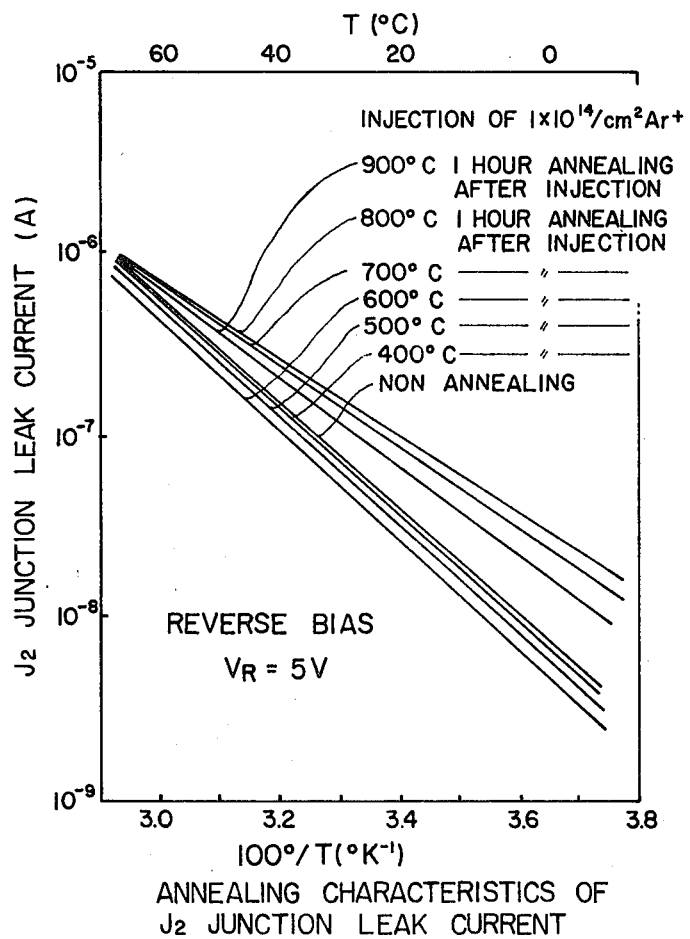
FIGS. 2 and 3 are explanatory diagrams showing annealing effects to the reverse leak current in a junction in the element in FIG. 1.
Figure 3:
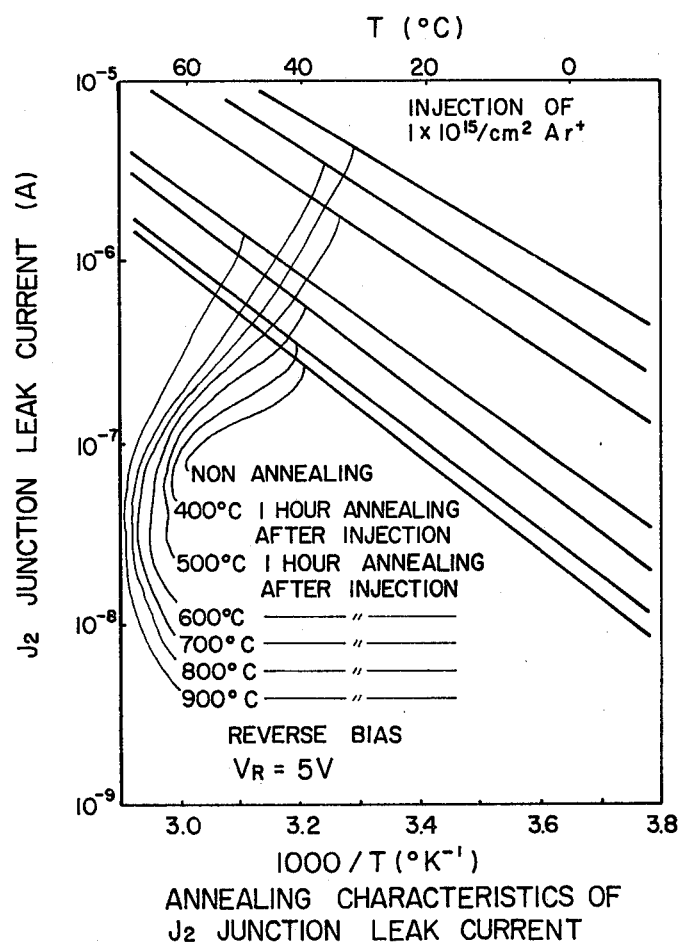

Variations in the reverse leakage current are illustrated in FIGS. 2 and 3. FIG. 2 indicates the leakage current and annealing temperature for a case where the argon ion implantation has been carried out at an implantation dose of $1 \times 10^{14}/cm^2$ at an energy level of 180 KeV and with the annealing carried out in a nitrogen atmosphere for one hour. As is clear from FIG. 2, in the case of a annealing temperature lower than 600° C. (inclusive) the amount of reverse leakage current is scarcely changed while in the case of annealing temperature of 700° C. the reverse leakage current is slightly increased. If the annealing temperature is increased to 900° C. or higher (not shown), the leakage current abruptly decreases as the defect is recovered.

For a case where the argon ion implantation dose is $1 \times 10^{15}/cm^2$ as shown in FIG. 3, the leakage current slightly increases at a temperature of 500° C. The leakage current increases with temperature. If the annealing temperature exceeds 900° C. (not shown), the defect is recovered and the leakage current abruptly decreases. As the ion implantation dose is further increased, this tendency becomes significant and the leakage current increases rapidly.

The thermo-sensitive characteristic of a thermo-sensitive thyristor having a defective junction produced by argon ion implantation can be changed by utilizing the above-described annealing characteristic. That is, when a low temperature annealing is carried out in a nitrogen atmosphere after argon ions have been implanted into the junction $J_2$, only the leakage current into the junction $J_2$ is changed and the common base current amplification factors are maintained at their original values. Therefore, for annealing at temperatures lower than 900° C., the leakage current is increased and therefore the element will have a low temperature thermo-sensitive characteristic, that is, the temperature at which switching between high and low resistivity states takes place is low. In addition, the annealing effects become more significant as the argon ion implantation dose is increased. Therefore the thermo-sensitive characteristic can be changed by annealing even after the metal electrodes have been formed on the element.

As is apparent from the above description, after almost all of the final characteristics of the element have been checked, the thermo-sensitive characteristic can be precisely set to a desired value by annealing. Therefore, the manufacturing yield for thermo-sensitive devices of the invention is greatly increased. In addition, the characteristics of the device can be checked by merely measuring the breakover voltage of the element. Thus, the method of the invention is considerably simple.

By way of example, the method of the invention can be practiced as follows. After the thermo-sensitive characteristic of a switching element has been checked, annealing is carried out at temperature of 430° C. in a nitrogen atmosphere. As a result, switching temperatures can be adjusted in the range of 5° to 10° C.

As initial defects produced by argon ion implantation are changed to stable defects by the annealing, the reliability of the element is improved with the use of the invention. The above-described annealing temperature and time of treatment are dependent upon the argon ion implantation dose, the characteristics of the switching element before annealing and the intended adjustment temperature range.

As is apparent from the above description, according to the method of the invention, the thermo-sensitive characteristic of a thermo-sensitive thyristor element in which a defective junction has been formed by implantation of argon ions can be precisely set in a final step of the wafer processing. Therefore, the yield of the element manufacturing process is remarkably increased and the reliability of the manufactured elements is improved.

The invention has been described with respect to the manufacture of thermo-sensitive thyristor elements. However, it should be noted that the invention is not limited thereto or thereby. That is, the technical concept of the invention can be similarly applied to the manufacture of semiconductor elements which utilize other than argon ion implantation methods.

What is claimed is:

1. A method of manufacturing a semiconductor element having a four-layer pnpn structure including a first semiconductor region of a first conductivity type, a second semiconductor region of a second conductivity type in contact with said first semiconductor region through a first pn junction, a third semiconductor region of said first conductivity type in contact with said second semiconductor region through a second pn junction, and a fourth semiconductor region of said second conductivity type in contact with said third semiconductor region through a third pn junction, said second pn junction having a defect layer formed therein by implantation of argon ions, comprising subjecting said element to annealing at a temperature in a range of from 400° C. to 900° C. in a nitrogen atmosphere after said argon ion implantation, said temperature of said annealing being determined in accordance with a desired switching temperature.

2. The method as claimed in claim 1 in which said argon ion implantation is carried out at a dose of from $1\times10^{14}/cm^2$ to $1\times10^{15}/cm^2$ with an energy of 180 KeV.

3. The method as claimed in claim 2 wherein said annealing is carried out for a period of approximately one hour.

4. The method as claimed in claim 1 in which said annealing is carried out at a temperature of 430° C. in a nitrogen atmosphere after said argon ion implantation.

* * * * *